United States Patent [19]

Kitamura

[11] Patent Number: 4,479,221
[45] Date of Patent: Oct. 23, 1984

[54] METHOD OF AND APPARATUS FOR REGULATING THE QUANTITY OF LIGHT OF AN ARRAY-LIKE LIGHT SOURCE

[75] Inventor: Takashi Kitamura, Yokohama, Japan

[73] Assignee: Canon Kabushiki Kaisha, Tokyo, Japan

[21] Appl. No.: 317,385

[22] Filed: Nov. 2, 1981

[51] Int. Cl.³ .............................................. H01S 3/13
[52] U.S. Cl. ...................................... 372/31; 372/96; 372/75
[58] Field of Search ................ 372/43, 29, 96, 44, 372/75, 70, 25, 20, 31; 331/50, 52, 55; 332/42, 7, 51

[56] References Cited

U.S. PATENT DOCUMENTS

| | | | |
|---|---|---|---|
| 3,727,061 | 4/1973 | Dworkin | 373/44 |
| 4,246,548 | 1/1981 | Rutz | 372/44 |
| 4,359,773 | 11/1982 | Swartz et al. | 372/43 |

Primary Examiner—William L. Sikes
Assistant Examiner—Léon Scott, Jr.
Attorney, Agent, or Firm—Fitzpatrick, Cella, Harper & Scinto

[57] ABSTRACT

A method in which, rearwardly of an array-like light source having a plurality of semiconductor lasers arranged in an array, a light detector for detecting the rearwardly emitted beams from the semiconductor lasers is provided and the peak value of each of the semiconductor lasers is detected by the light detector so that the peak values of the semiconductor lasers can be made equal to one another, whereby the quantity of light from each of the semiconductor lasers is regulated.

6 Claims, 6 Drawing Figures

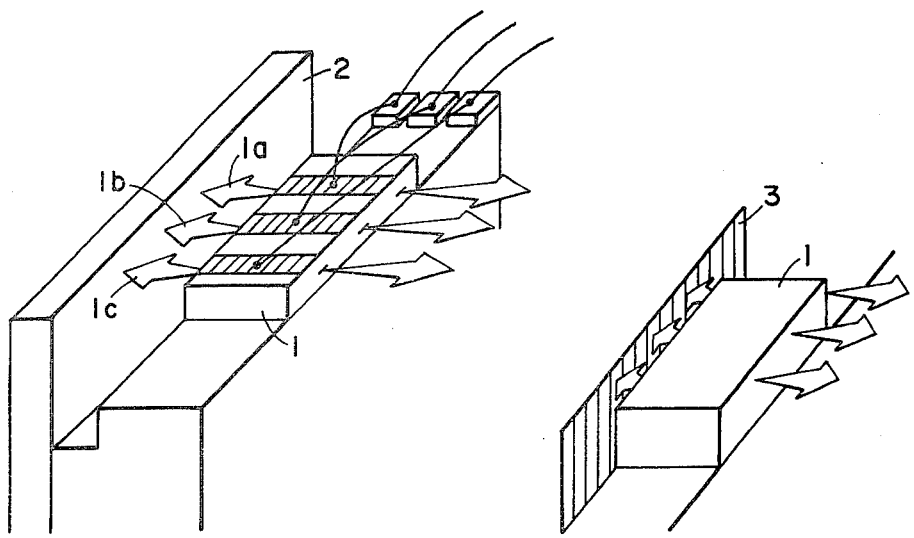
FIG. 1
PRIOR ART
FIG. 2
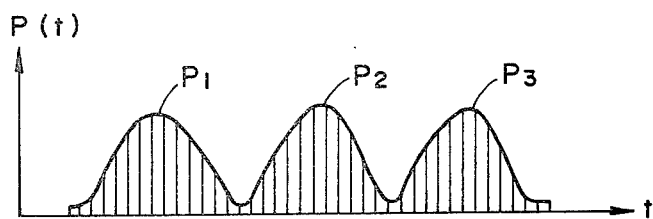
FIG. 3
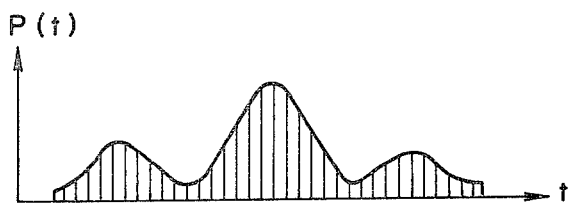
FIG. 4

METHOD OF AND APPARATUS FOR REGULATING THE QUANTITY OF LIGHT OF AN ARRAY-LIKE LIGHT SOURCE

BACKGROUND OF THE INVENTION

1. Field of the Invention

This invention relates to the regulating of the quantity of light from a light source comprising semiconductor lasers arranged in an array form.

2. Description of the Prior Art

Generally, the method of using a semiconductor laser as a so-called array-like light source having a plurality of independently drivable light-emitting points has various merits. Particularly, where it is used as an image recording light source in a laser beam printer or the like, the use of an array-like light source is very effective for the reasons that:

(1) a plurality of scanning lines can be recorded or displayed at a time and this leads to a high speed recording or display;

(2) therefore, the speeds of a galvanomirror, a rotatable polygonal mirror, etc., that deflect the laser beams may be slow; and (3) the power of the semiconductor laser may be low and this is advantageous in view of deterioration.

However, the use of an array-like light source results in the following problems:

(1) the characteristics of individual lasers are irregular; and (2) the speed of deterioration differs from one laser to another (due to the difference in frequency of use).

Therefore, a quantity-of-light regulating mechanism is necessary so that individual semiconductor lasers arranged in an array form may provide the same quantity of light. As an example of such a method, there is a method as shown in FIG. 1 of the accompanying drawings. This is a method whereby the back beams 1a, 1b and 1c of a semiconductor laser array 1 are received by a large detector 2 to detect the quantity of light of each beam. In this method, a large detector which covers the expanse of each emitted beam is necessary to detect the integrated value of the quantity of light of each semiconductor laser and the lasers must be turned on one by one to detect the quantity of light in time-series fashion. Accordingly, the number of arrays of semiconductor lasers is increased and the trouble of turning on and off the lasers successively exists. Moreover, the size of the detector is large and high-speed regulation of the quantity of light is difficult.

SUMMARY OF THE INVENTION

It is an object of the present invention to overcome the above-noted disadvantages and to provide a method of and an apparatus for regulating the quantity of light of each individual laser at high speed.

In the method according to the present invention, the back beams of a plurality of semiconductor lasers arranged in an array form are detected by a CCD or a MOS type detector array so that the peak powers thereof can be made are equal to one another, whereby the quantities of light of the semiconductor lasers are made equal to one another. Accordingly, in the present invention, the necessity of turning on and off the semiconductor lasers one by one is eliminated and the lasers can be made to emit light at one time to effect regulation of the quantity of light and this leads to the possibility of enhancing the regulation speed.

The invention will become more fully apparent from the following detailed description thereof taken in conjunction with the accompanying drawings.

BRIEF DESCRIPTION OF THE DRAWINGS

FIG. 1 illustrates the quantity-of-light regulation according to the prior art.

FIGS. 2, 3 and 4 illustrate the quantity-of-light regulating method according to the present invention.

DESCRIPTION OF THE PREFERRED EMBODIMENTS

Figure 5:
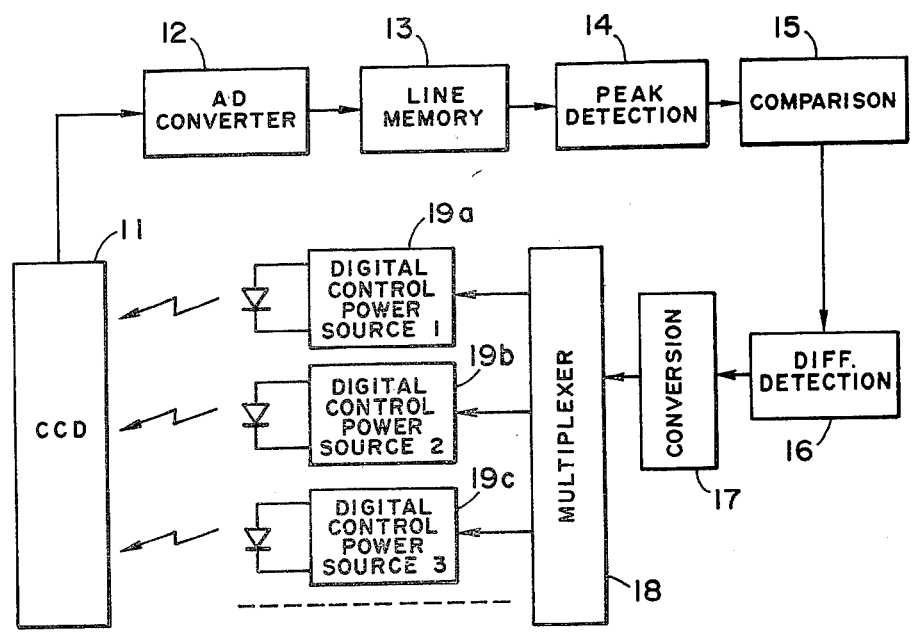
FIG. 5 shows an embodiment of the signal processing system of the apparatus according to the present invention.

FIG. 2 shows the construction of the present invention in which the back beams of semiconductor lasers are detected by a CCD detector 3 and feedback of the quantity of light is effected.

FIG. 3 shows the output P from such CCD, and an output signal is obtained in accordance with the light output from each laser. The horizontal axis t represents the position in the direction of a sensor array. If the light outputs of respective lasers are the same, the peak values P1, P2 and P3 of such output signals are constant.

FIG. 4 shows a graph in which the light output intensities P of respective lasers differ from one another, and the peak values of three output signals differ from one another. Accordingly, if feedback control is used so that these peak values are regulated to be the same as a certain reference value, the powers of respective lasers can theoretically be made uniform.

As the precondition of a method, the distributions of the emitted light patterns of respective lasers (far field pattern which will hereinafter be referred to as FFP) must be the same. Accordingly, by making the peak values of the output signals, uniform the integrated values of the light outputs of respective lasers (the total light output) can constantly be uniform. This is so because it is known that the shape of the FFP is almost identical for array-like lasers constructed into an identical wafer form and is nearly invariable for deterioration of elements, and this sufficiently satisfies the aforementioned condition. Also, depending on the usage, there is a case where it is preferable to make the quantity of light constant at the peak value rather than to make the quantity of light constant at the integrated value of the light output of each laser. This is, for example, the case when the light energy used for recording or the like is only the central part of the FFP and the remainder is not used for recording. Even in such a case, it is necessary to make a design such that the quantity of light is constant at the peak value, and this is more direct than and preferable to the method as shown in FIG. 1 wherein detection is made by the integrated value. The position at which such a CCD detector is placed should preferably be near the light-emitting surface of the laser as much as possible. This is because if the CCD detector is placed remotely, the lights from adjacent lasers overlap each other to give rise to errors in the detection of the peak values. For example, if the spacing between arrays is 100 $\mu$m and the half-value total angle of the emitted beam FFP from each laser in the array direction is 10° and if the distance to the detector is 1.1 mm, then an error of 50% will occur. Accordingly, the distance to the detector must be less than that in order to make adjustment with high accuracy. However, if it is difficult to dispose the detector near the light-emitting surface of the laser, it will be possible to turn on several lasers at one time to reduce the error, as will hereinafter be described with reference to FIGS. 6A and 6B.

FIG. 5 shows an example of the signal processing system in the present invention. The output signal from CCD 11 is converted into a digital signal through an AD converter 12 and applied to a line memory 13. The information in the line memory 13 is subjected to a suitable process, whereafter the peak value thereof is obtained in a peak value detecting circuit 14. If the array is a three-element array and there are three peaks, three values will be obtained. Thereafter, such peak values are compared with a reference peak value by a comparison circuit 15, and the difference therebetween is obtained in a difference detecting circuit 16. This difference corresponds to the value of the quantity of light to be corrected by a conversion circuit 17, and is multiplied by a suitable factor and converted into an electrical current value. The above-described processing is effected digitally. The electrical current value is fed back by a multiplexer 18 to a driver corresponding to each laser. Each laser driver comprises a digital control power source 19a, 19b, 19c and, when input with a digital value, a corresponding electrical current value is output therefrom to drive the semiconductor laser. The output from the multiplexer 18 increases or decreases the input digital value of the digital control power source 19a, 19b, 19c for each semiconductor laser and increases or decreases the light output from each semiconductor laser. When the peak values have become completely coincident with the reference peak value, the above-described operation is terminated.

In the above-described manner, it has become possible to make uniform at a constant value the quantities of light of the semiconductor lasers arranged in an array form, whereas if the array spacing of the semiconductor lasers is narrow and the position at which the CCD detector is placed is spaced apart from the light-emitting point, lights will overlap each other to prevent the peak values from being accurately obtained, as previously described.

Figure 6:
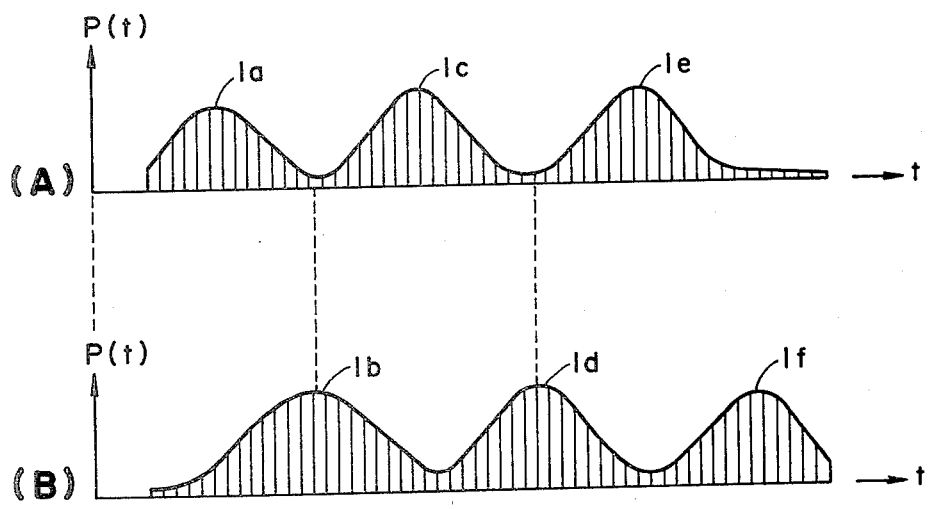
FIGS. 6A and 6B show another quantity-of-light regulating method according to the present invention.

FIGS. 6A and 6B show a solution to such a case. It is assumed that there are six light-emitting points 1a-1f of the semiconductor lasers. The light-emitting points which are first to emit light at one time are 1a, 1c and 1e, and the manner of detection by the detector at this time is shown in FIG. 6A. Assume that the light-emitting points 1b, 1d and 1f emit light subsequently but at one time. The manner of detection by the detector at this time is shown in FIG. 6B. In this manner, light emission takes place at two times, whereby overlapping of the quantities of light is alleviated. In this method, rapidity is more or less reduced, but the arrangement of the detector is simplified. Likewise, it also becomes possible to arrange the light-emitting points such that every three or four of them emits light at one time.

Thus, the present invention provides a high-speed and simple quantity-of-light regulating mechanism.

The detector array such as a CCD in the present invention may be either one-dimensional line sensors or two-dimensional image sensors. However, where one-dimensional line sensors are used, it is necessary to preset them so that the direction of the arrangement of the sensors is just coincident with the maximum peak of each laser. Also, accuracy will be increased if the values of the several bits before and after the peak value are read at a time and a mean value thereof is obtained when each peak value is to be detected. This will become a result including more or less of the integration effect. Where the spacing between the CCD and the lasers is narrow, the quantity of light will be concentrated upon a narrow area and this will lead to occurrence of a phenomenon that the CCD output is saturated. In such a case, an ND filter or a polarizing plate may be inserted to reduce the quantity of light and direct it to CCD. Since the semiconductor lasers effect linear polarization, a polarizing plate can be particularly utilized as a variable filter by regulating its angle of rotation.

What I claim is:

1. A method of regulating the quantity of light emitted from each of a plurality of semiconductor lasers arranged in the form of an array, comprising the steps of:

detecting a rearwardly emitted beam from each of said semiconductor lasers with light detecting means provided rearwardly of said plurality of semiconductor lasers, said light detecting means generating a signal representing the quantity of light of the beam emitted from each said laser;

detecting a peak value of the quantity of light of the rearwardly emitted beam from each of said semiconductor lasers from the signal generated by said light detecting means; and regulating the peak value of the quantity of light of the rearwardly emitted beam from each of said semiconductor lasers so that all said peak values are equal to one another, on the basis of the detected peak value of each of said semiconductor lasers.

2. A method of regulating the quantity of light emitted from each of a plurality of semiconductor lasers arranged in the form of an array, comprising the steps of:

detecting a rearwardly emitted beam from each of said semiconductor lasers with a detector array provided rearwardly of said plurality of semiconductor lasers, said detector array generating a signal representing the quantity of light of the beam emitted from each said laser;

detecting a peak value of the quantity of light of the rearwardly emitted beam from each of said semiconductor lasers at one time from the signal generated by said detector array;

comparing the peak values of the quantity of light of the rearwardly emitted beam from each of said semiconductor lasers to a reference peak value; and equalizing the peak values of the quantity of light of the rearwardly emitted beams from each of said semiconductor lasers on the basis of the difference between the peak values detected in said peak value detecting step and the reference peak value as determined in said comparing step.

3. A method of regulating the quantity of light emitted from each of a plurality N of semiconductor lasers arranged in the form of an array, comprising the steps of:

detecting a rearwardly emitted beam from each of said semiconductor lasers with a detector array provided rearwardly of said plurality of semiconductor lasers by sequentially turning on m different subsets (N/m) of said plurality N of said semiconductor lasers, with the lasers in each said subset being spaced apart in said array by (m-1) lasers, said detector array generating a signal representing the quantity of light emitted from each said laser;

detecting a peak value of the quantity of light rearwardly emitted from each of said semiconductor lasers from the signal generated by said detector array; and regulating the peak value of the quantity of light of the rearwardly emitted beam from each of said semiconductor lasers so that all said peak values are equal to one another, on the basis of the detected peak value of each of said semiconductor lasers.

4. An apparatus for regulating the quantity of light from each of a plurality of semiconductor lasers arranged in an array, comprising:

a plurality of semiconductor lasers arranged in an array, each of said lasers rearwardly emitting a beam;

means for detecting the rearwardly emitted beam from each of said semiconductor lasers; for generating a signal representing the quantity of light of the rearwardly emitted beam from each of said semiconductor lasers; and for detecting a peak value of the quantity of light of the rearwardly emitted beam from each of said semiconductor lasers on the basis of the signal; and means for regulating the peak values of the quantity of light emitted from each of said semiconductor lasers so that the peak values are equal to one another, on the basis of the signal generated by said detecting means.

5. An apparatus for regulating the quantity of light from each of a plurality of semiconductor lasers arranged in an array, comprising:

a plurality of semiconductor lasers arranged in an array, each of said lasers rearwardly emitting a beam;

means for supplying a driving electric current to each of said semiconductor lasers;

light detector means, mounted rearwardly of said plurality of semiconductor lasers, for detecting the quantity of light of each of the rearwardly emitted beams from each of said semiconductor lasers; for generating a signal representing the quantity of light of the rearwardly emitted beam from each of said semiconductor lasers; and for detecting a peak value of the rearwardly emitted beam from each of said lasers on the basis of the signal; and an electric circuit connected to said detector means and having means for imparting a modifying value to the driving electrical current supplied by said supplying means to each of said semiconductor lasers in accordance with the signal from said light detector means so that the peak values of the quantity of light of the rearwardly emitted beam from each of said semiconductor lasers are equal to one another.

6. An apparatus according to claim 5, further comprising light attenuating means for preventing saturation of the photoelectric output generated by said light detector means disposed between the array of said semiconductor lasers and said light detector means.

* * * * *